(12) United States Patent
Chen et al.

(10) Patent No.: US 11,927,631 B2
(45) Date of Patent: Mar. 12, 2024

(54) TEST METHOD AND APPARATUS OF COMMUNICATION CHIP, DEVICE AND MEDIUM

(71) Applicant: MORNINGCORE TECHNOLOGY CO., CHINA, Shanghai (CN)

(72) Inventors: Shanzhi Chen, Shanghai (CN); Guobin Su, Shanghai (CN); Yun Yang, Shanghai (CN)

(73) Assignee: MORNINGCORE TECHNOLOGY CO., CHINA (CN)

( * ) Notice: Subject to any disclaimer, the term of this patent is extended or adjusted under 35 U.S.C. 154(b) by 56 days.

(21) Appl. No.: 17/777,561

(22) PCT Filed: May 6, 2020

(86) PCT No.: PCT/CN2020/088693
§ 371 (c)(1),
(2) Date: May 17, 2022

(87) PCT Pub. No.: WO2021/098157
PCT Pub. Date: May 27, 2021

(65) Prior Publication Data
US 2022/0397605 A1 Dec. 15, 2022

(30) Foreign Application Priority Data

Nov. 22, 2019 (CN) .......................... 201911159004.3

(51) Int. Cl.
*G01R 31/3183* (2006.01)
*G01R 31/3167* (2006.01)
(Continued)

(52) U.S. Cl.
CPC .... *G01R 31/31835* (2013.01); *G01R 31/3167* (2013.01); *G01R 31/31703* (2013.01);
(Continued)

(58) Field of Classification Search
CPC . H04L 1/242; H04L 1/24; H04L 1/244; G06F 11/2038; G06F 11/263;
(Continued)

(56) References Cited

U.S. PATENT DOCUMENTS 6,760,873 B1 * 7/2004 Hao ................. G01R 31/31715
714/724
2009/0119053 A1 * 5/2009 Tseng ............... H04L 25/03866
702/117
(Continued)

FOREIGN PATENT DOCUMENTS

| CN | 1110073 A | 10/1995 |
|---|---|---|
| CN | 101188529 E1 | 5/2008 |

(Continued)

OTHER PUBLICATIONS

International Search Report dated Aug. 24, 2020 in International Application No. PCT/CN2020/088693.
(Continued)

*Primary Examiner* — April Y Blair
*Assistant Examiner* — Sazzad Hossain
(74) *Attorney, Agent, or Firm* — Kim IP Law Group LLC

(57) ABSTRACT

Provided test method and apparatus of communication chip, device and medium. The test method of communication chip includes receiving end test method and transmitting end test method. The receiving end test method of the communication chip includes: an idle time slot of the receiving end of the communication chip is detected in a running process of the communication chip; a test vector is generated, and a standard result corresponding to the test vector is generated; a data frame containing the test vector is constructed, and the data frame is sent to the receiving end of the communication chip in the idle time slot to enable the receiving end of the communication chip to process the data frame; and a chip (Continued)

processing result uploaded by the receiving end of the communication chip is received, and the standard result is compared with the chip processing result.

4 Claims, 8 Drawing Sheets

(51) Int. Cl.
*G01R 31/317* (2006.01)
*G01R 31/3181* (2006.01)
*G01R 31/319* (2006.01)
*G06F 11/20* (2006.01)
*G06F 11/263* (2006.01)
*G11C 29/10* (2006.01)
*H04B 17/29* (2015.01)
*H04L 1/24* (2006.01)

(52) U.S. Cl.
CPC .... *G01R 31/31813* (2013.01); *G01R 31/3183* (2013.01); *G01R 31/318385* (2013.01); *G01R 31/31908* (2013.01); *G06F 11/2038* (2013.01); *G06F 11/263* (2013.01); *G11C 29/10* (2013.01); *H04B 17/29* (2015.01); *H04L 1/24* (2013.01); *H04L 1/242* (2013.01); *H04L 1/244* (2013.01)

(58) Field of Classification Search
CPC .............. G11C 29/10; G01R 31/31703; G01R 31/318385; G01R 31/31908; G01R 31/31813; G01R 31/3167; G01R 31/3183; H04B 17/29
See application file for complete search history.

(56) References Cited

U.S. PATENT DOCUMENTS

| | | | |
|---|---|---|---|
| 2012/0047411 | A1 | 2/2012 | Lai et al. |
| 2015/0212151 | A1* | 7/2015 | Picalausa ......... G01R 31/31932 714/727 |

FOREIGN PATENT DOCUMENTS

| | | |
|---|---|---|
| CN | 101541028 A | 9/2009 |
| CN | 108737307 A | 11/2018 |
| CN | 110824343 A | 2/2020 |

OTHER PUBLICATIONS

Written Opinion dated Aug. 24, 2020 in International Application No. PCT/CN2020/088693.

* cited by examiner

TEST METHOD AND APPARATUS OF COMMUNICATION CHIP, DEVICE AND MEDIUM

CROSS-REFERENCE TO RELATED APPLICATION(S)

This is a national stage application filed under 37 U.S.C. 371 based on International Patent Application No. PCT/CN2020/088693, filed May 6, 2020, which claims priority to Chinese Patent Application No. 201911159004.3 filed with the China National Intellectual Property Administration (CNIPA) on Nov. 22, 2019, the disclosures all of which are hereby incorporated herein by reference in their entireties.

TECHNICAL FIELD

Embodiments of the present application relate to the field of communication technologies, and for example, a test method of a communication chip, a test apparatus of a communication chip, an electronic device and a medium.

BACKGROUND

With the continuous development of the communication technology, communication chips are widely applied in the fields of mobile communications, wireless networks, wireless data transmission industry and the like, and the safety of functions of the communication chips has great influence on various industries.

In the related art, the test of the communication chips mainly focuses on obvious quality problems such as whether the communication chip can normally communicate, whether a cell can reside or whether a communication link is established, but the function safety test of the communication chip is less, and function safety test can only be performed on the communication chip in a manner such as parity check bit (Parity), error correcting code (ECC), Redundancy Design, and Dual Lock step.

In the related art, according to a method for performing a function safety test on the communication chip in the manner of Parity or ECC, test nodes cannot be accurately distinguished, which causes that test coverage rate is low; whereas, according to a method for performing the function safety test on the communication chip in the manner of Redundancy Design or Dual Lock step, the function safety is improved at the cost of sacrificing chip resources and performance, and in the above manners, the communication chip can only be tested in an offline state.

SUMMARY

Embodiments of the present application provide a test method of a communication chip, a test apparatus of a communication chip, an electronic device and a medium, to realize an online test of function safety for communication chips, and solve the problems of low test coverage rate of the communication chip and large amount consumption of communication chip resource performance in a test process in the related art.

In a first aspect, embodiments of the present application provide a test method of a communication chip. The method includes that: in a running process of the communication chip, an idle time slot of a receiving end of the communication chip is detected; a test vector is generated, and a standard result corresponding to the test vector is generated; a data frame containing the test vector is constructed, and the data frame is sent to the receiving end of the communication chip in the idle time slot to enable the receiving end of the communication chip to process the data frame; and a chip processing result uploaded by the receiving end of the communication chip is received, and the standard result is compared with the chip processing result.

In a second aspect, embodiments of the present application further provide a test method of a communication chip. The method includes: in a running process of the communication chip, an idle time slot of a transmitting end of the communication chip is detected; a test vector is generated, and a standard result corresponding to the test vector is generated; a data frame containing the test vector is constructed, and the data frame is sent to the transmitting end of the communication chip in the idle time slot to enable the transmitting end of the communication chip to process the data frame; and a chip processing result uploaded by the transmitting end of the communication chip is received, and the standard result is compared with the chip processing result.

In a third aspect, embodiments of the present application further provide a test apparatus of a communication chip. The apparatus includes a receiving end idle time slot detection module, a standard result generation module, a chip processing result generation module, and a standard result and chip processing result comparison module. The receiving end idle time slot detection module is configured to detect, in a running process of the communication chip, an idle time slot of a receiving end of the communication chip. The standard result generation module is configured to generate a test vector and a standard result corresponding to the test vector. The chip processing result generation module is configured to construct a data frame containing the test vector, and send the data frame to the receiving end of the communication chip through the idle time slot to enable the receiving end of the communication chip to process the data frame. The standard result and chip processing result comparison module is configured to receive a chip processing result uploaded by the receiving end of the communication chip, and compare the standard result with the chip processing result.

In a fourth aspect, embodiments of the present application further provide a test apparatus of a communication chip. The apparatus includes a transmitting end idle time slot detection module, a standard result generation module, a chip processing result generation module, and a standard result and chip processing result comparison module. The idle time slot detection module of the transmitting end is configured to detect, in a running process of the communication chip, an idle time slot of a transmitting end of the communication chip. The standard result generation module is configured to generate a test vector and a standard result corresponding to the test vector. The chip processing result generation module is configured to construct a data frame containing the test vector, and send the data frame to the transmitting end of the communication chip through the idle time slot to enable the transmitting end of the communication chip to process the data frame. The standard result and chip processing result comparison module is configured to receive a chip processing result uploaded by the transmitting end of the communication chip, and compare the standard result with the chip processing result.

In a fifth aspect, embodiments of the present application further provide a computer device. The computer device includes a memory, a processor and a computer program stored in the memory and executable by the processor, where the computer program, when executed by the processor, implements the test method of the communication chip of any one of the embodiments of the present application.

In a sixth aspect, embodiments of the present application further provide a non-transitory computer-readable storage medium, storing a computer program, where the computer program, when executed by a processor, implements the test method of the communication chip of any one of the embodiments of the present application.

DETAILED DESCRIPTION

Figure 1:
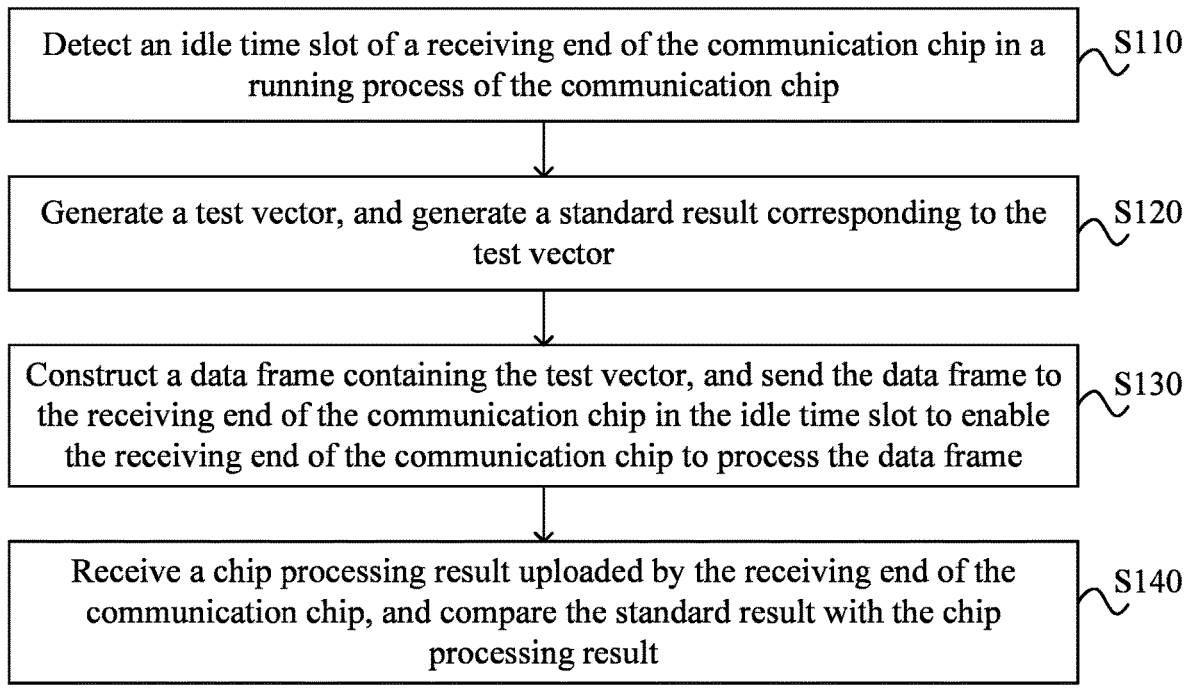
FIG. 1 is a schematic flowchart of a test method of a communication chip according to embodiment one of the present application.

Embodiments of the present application will be described in conjunction with the accompanying drawings and embodiments below. It should be understood that the specific embodiments described herein are merely illustrative of the embodiments of the present application and not restrictive of the embodiments of the present disclosure. In addition, it should also be noted that, for ease of description, only part, but not all, of the structures related to the embodiments of the present application are shown in the drawings.

Before discussing the exemplary embodiments, it should be noted that some exemplary embodiments are described as processes or methods depicted as flowcharts. Although the flowchart describes various operations (or steps) as sequential processes, many of the operations may be performed in parallel, concurrently or simultaneously. Moreover, the order of the operations may be rearranged. When operations for the process are completed, the process may be terminated, and may also have additional operations not included in the drawings to be performed. The process may correspond to a method, a function, a procedure, a subroutine, a subprogram, and the like.

In the related art, the test of the communication chips mainly focuses on obvious quality problems such as whether the communication chip can normally communicate, whether a cell can reside or whether a communication link is established, but the function safety test of the communication chip is less, and function safety test can only be performed on the communication chip in a manner such as parity check bit (Parity), error correcting code (ECC), Redundancy Design, and Dual Lock step.

In the related art, according to a method for performing a function safety test on the communication chip in the manner of Parity or ECC, test nodes cannot be accurately distinguished, which causes that test coverage rate is low; whereas, according to a method for performing the function safety test on the communication chip in the manner of Redundancy Design or Dual Lock step, the function safety is improved at the cost of sacrificing chip resources and performance, and in the above manners, the communication chip can only be tested in an offline state.

The applicant considers whether the function safety of the communication chip can be tested through an idle time slot, to achieve increasing test coverage rate as much as possible, and to achieve reducing the large amount consumption of communication chip resource performance, to solve the problems in the related art that the function safety test method of the communication chip is low in coverage rate and a large amount of communication chip resource performance is consumed in a test process.

The applicant analyzes an Internet of Vehicles communication chip and communication protocols therefor. C-V2X is a vehicle wireless communication technology evolved based on a cellular network communication technology such as a 3rd-Generation mobile communication technology (3G), a 4th-Generation mobile communication technology (4G), or a 5th-Generation mobile communication technology (5G), and the C-V2X includes two communication interfaces: one communication interface is a short-distance direct communication interface (PC5) among a vehicle, a person, and a road, the other communication interface is a communication interface (Uu) between a terminal and a base station, through which a long-distance and larger-range reliable communication can be achieved. C-V2X is a communication technology based on 3rd generation partnership project (3GPP) globally universal standards, and includes LTE-V2X and 5G-V2X. A smooth evolution is supported from the LTE-V2X towards the 5G-V2X from a technology evolution point of view. The applicant analyzes the time slot frame structure of the LTE-V2X based on PC5 and Uu interfaces and the time slot frame structure of 5G-V2X protocols, and finds that time division duplexing (TDD) mechanism is adopted for all radio frame structures of the PC5 interface, the Uu interface and the 5G-V2X. Therefore, it is available to detect an idle time slot and perform a function safety test on the communication chip through the idle time slot.

Based on the above thinking, the applicant proposes that an idle time slot of the receiving end of the communication chip is detected in a running process of the communication chip; a test vector is generated, and a standard result corresponding to the test vector is generated; a data frame containing the test vector is constructed, and the data frame is sent to the receiving end of the communication chip in the idle time slot to enable the receiving end of the communication chip to process the data frame; and a chip processing result uploaded by the receiving end of the communication chip is received, and the standard result is compared with the chip processing result, achieving that the function safety test of the communication chip is performed on line, and solving the problems in the related art that the test coverage rate of the communication chip is low and a large amount of communication chip resource performance is consumed in the test process.

Embodiment One

FIG. 1 is a schematic flowchart of a test method of a communication chip according to embodiment one of the present application, the present embodiment is applicable to a case of performing a function safety test on a receiving end of the communication chip in a running process of the communication chip, and the method may be executed by a test apparatus of the communication chip, and the test apparatus may be implemented in software and/or hardware and integrated in a computer device performing the test method of the communication chip. For example, with reference to FIG. 1, the method includes following operations S110-S140.

In S110, in a running process of the communication chip, an idle time slot of a receiving end of the communication chip is detected.

The communication chip involved in the embodiments of the present application may be a communication chip involved in the fields of Internet of Vehicles, mobile communication, wireless network, wireless data transmission industry and the like. Any communication chip may be tested through the test method of the communication chip involved in the embodiments of the present application.

In the present embodiment, the receiving end of the communication chip is mainly used for receiving communication signals sent by other modules or chips, and the communication chip can process the communication signals received by the receiving end of the communication chip and send the processed communication signals to a transmitting end of the communication chip, and the processed communication signals can be sent to other modules or chips through the transmitting end of the communication chip.

In the present embodiment, a communication protocol refers to regulations and agreements that entities at two communication sides must follow to complete a communication or service. As an example, in a case where communication between a communication chip A and a communication chip B is to be achieved, the communication between the communication chip A and the communication chip B may be achieved according to a preset communication protocol.

In the present embodiment, the idle time slot of the receiving end of the communication chip is detected in the running process of the communication chip. The idle time slot of the receiving end of the communication chip may be a time slot when the receiving end of the communication chip does not receive communication signals from other modules or chips, and in this time slot, the receiving end of the communication chip does not need to receive communication signals, or does not need to send communication signals to the transmitting end of the communication chip for processing. As an example, a detection signal may be sent to the receiving end of the communication chip, a processing result of the detection signal sent by the receiving end of the communication chip is received, and the idle time slot of the receiving end of the communication chip is acquired according to the processing result of the detection signal by the receiving end of the communication chip. In the present embodiment, the detection signal is an analog detection signal and/or a digital detection signal. When the idle time slot is detected, the function safety test is started to be performed on the receiving end of the communication chip. In an embodiment, for different communication protocols, idle time slots of the receiving end of the communication chip are different, so that the idle time slot of the receiving end of the communication chip may be detected only by sending an analog detection signal and/or a digital detection signal to the receiving end of the communication chip.

In S120, a test vector is generated, and a standard result corresponding to the test vector is generated.

In the present embodiment, when the idle time slot of the receiving end of the communication chip is detected, the test vector may be generated, and the standard result corresponding to the test vector may be generated. In an embodiment, the test vector may be a receiving end test stimulus Rx_Golden or other standard test stimulus, which is not limited in the embodiments of the present application.

In the present embodiment, for the receiving end of the communication chip, the test vector is a modulated signal subjected to coding and modulating. In the present embodiment, the function safety test of the receiving end of the communication chip should not bring any adversely effect to a normal working flow of the communication chip, therefore it is necessary to ensure that a power of the test vector cannot be higher than a power in a working time slot, and therefore, the power of the test vector needs to be adjusted in real time based on the power in the working time slot. As an example, in a case where the power of the test vector is 2 W, and the power of the working time slot is 1.5 W, then in this case, the power of the test vector needs to be adjusted to be lower than 1.5 W, which has advantages that resources of the communication chip would not be occupied excessively, and that operations of the communication chip would not be affected.

In an embodiment, the standard result corresponding to the test vector may include a digital-front-end standard result, a symbol-level standard result and a bit-level standard result.

In S130, a data frame containing the test vector is constructed, and the data frame is sent to the receiving end of the communication chip in the idle time slot to enable the receiving end of the communication chip to process the data frame.

In the present embodiment, after the test vector is generated, the data frame containing the test vector may be constructed, and the constructed data frame is sent to the receiving end of the communication chip in the idle time slot, so that the receiving end of the communication chip processes the data frame to obtain a chip processing result. As an example, in a case where the test vector generated online is a test vector a, a data frame A containing the test vector a may be constructed, and the data frame A is sent to the receiving end of the communication chip at the detected idle time slot of the receiving end of the communication chip, so that the receiving end of the communication chip may process the data frame A to obtain the chip processing result.

In an embodiment, the data frame is sent to the receiving end of the communication chip in the idle time slot, and the receiving end of the communication chip receives the data frame and performs a digital-front-end processing, a symbol-level processing and a bit-level processing on the data frame in sequence, to respectively obtain a digital-front-end processing result, a symbol-level processing result and a bit-level processing result as the chip processing result.

As an example, the computer device executing the test method may send the data frame A to the receiving end of the communication chip in the idle time slot, and the receiving end of the communication chip sequentially performs the digital-front-end processing, the symbol-level processing and the bit-level processing on the data frame A, to obtain the digital-front-end processing result, the symbol-level processing result and the bit-level processing result for the data frame A, respectively, and these processing results are taken as the chip processing results and uploaded to the computer device for executing the test method.

In S140, a chip processing result sent by the receiving end of the communication chip is received, and the standard result is compared with the chip processing result.

In an embodiment, receiving the chip processing result sent by the receiving end of the communication chip includes: receiving the digital-front-end processing result, the symbol-level processing result and the bit-level processing result uploaded by the receiving end of the communication chip.

In the present embodiment, after the chip processing result is obtained, the standard result is compared with the chip processing result. Whether the bit-level standard result and the bit-level processing result satisfy a consistency condition is determined; in response to a determination result that the bit-level standard result and the bit-level processing result satisfy the consistency condition, it is determined that the receiving end of the communication chip is safe, a loop test program is entered, and a next test is started; and in response to a determination result that the bit-level standard result and the bit-level processing result do not satisfy the consistency condition, the digital-front-end standard result is compared with the digital-front-end processing result, and the symbol-level standard result is compared with the symbol-level processing result to obtain segmented comparison results.

As an example, firstly, the bit-level standard result is compared with the bit-level processing result, and whether the bit-level standard result and the bit-level processing result satisfy the consistency condition is determined. In a case where the bit-level standard result and the bit-level processing result satisfy the consistency condition, the safety of the receiving end of the communication chip can be determined, and the function safety test of the receiving end of the communication chip in a next cycle may be performed. In a case where the bit-level standard result and the bit-level processing result do not satisfy the consistency condition, a failure point (Fail point) detected is reported to a host or a server, and the digital-front-end standard result and the digital-front-end processing result are compared and the symbol-level standard result and the symbol-level processing result are compared, so that segmented comparison results are obtained. The test method has the advantages that a failure range can be accurately determined or narrowed through the segmented comparison results, and users can conveniently and rapidly find the failure point to maintain the communication chip.

According to the solutions provided according the present embodiment, the idle time slot of the receiving end of the communication chip is detected in a running process of the communication chip; the test vector is generated, and the standard result corresponding to the test vector is generated; the data frame containing the test vector is constructed, and the data frame is sent to the receiving end of the communication chip in the idle time slot to enable the receiving end of the communication chip to process the data frame; and the chip processing result uploaded by the receiving end of the communication chip is received, and the standard result is compared with the chip processing result, so that the on-line test of the function safety of the communication chip is achieved, and the problems in the related art that the test coverage rate of the communication chip is low and a large amount of communication chip resource performance is consumed in the test process are solved.

Application Scenarios

Figure 2:
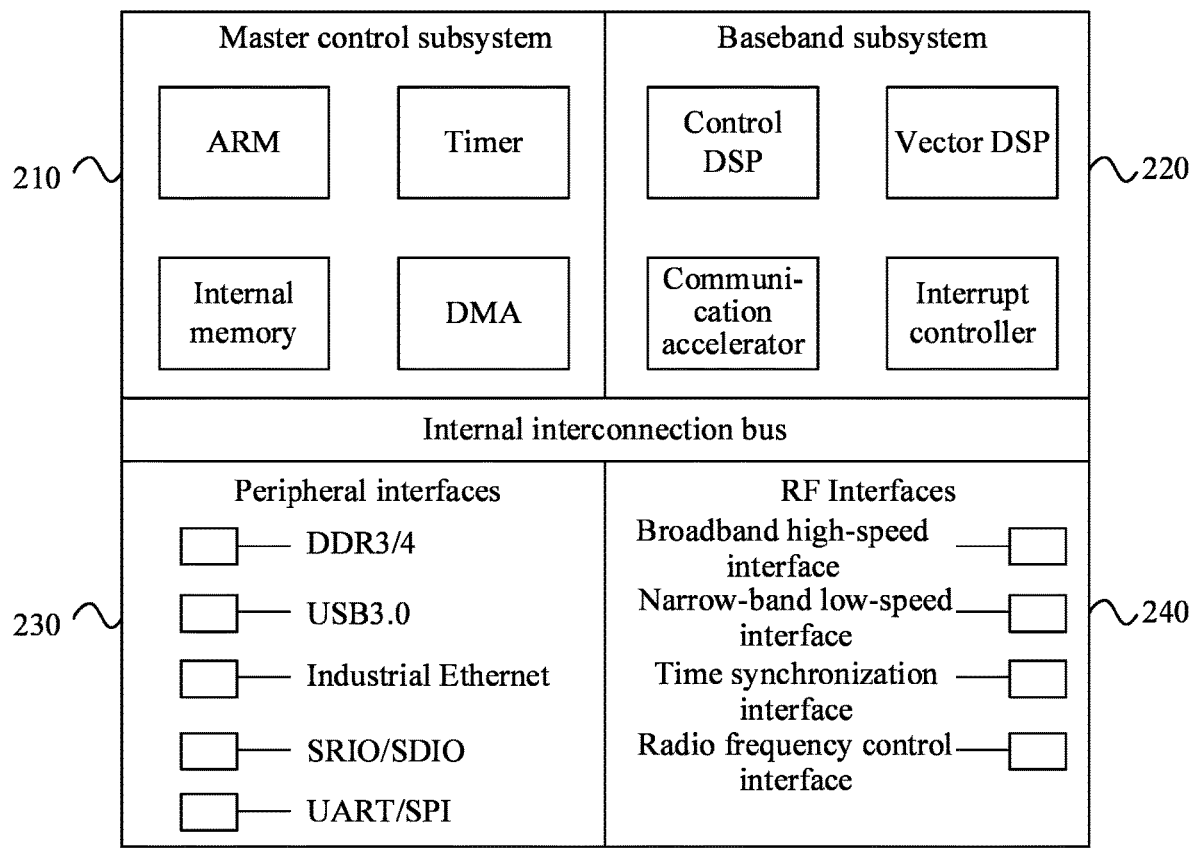
FIG. 2 is a structural block diagram of an Internet of Vehicles communication chip according to embodiment one of the present application.

FIG. 2 is a structural block diagram of an Internet of Vehicles communication chip according to embodiment one of the present application. The Internet of Vehicles communication chip mainly includes a master control subsystem 210, a baseband subsystem 220, peripheral interfaces 230 and a radio frequency interfaces 240. The master control subsystem 210 mainly includes: a random access memory (RAM), a timer, an internal memory (memory), and a direct memory access (DMA); the baseband sub-system 220 mainly includes: a control digital signal processor (DSP), a vector DSP, a communication accelerator, and an interrupt controller; the peripheral interfaces 230 mainly includes: Double Data Rate synchronous dynamic random access memory 3/4 (DDR 3/4), Universal Serial bus3.0 (USB 3.0), industrial ethernet (Ethernet), universal asynchronous receiver/transmitter (UART), serial peripheral interfaces (SPI), and the like; and the radio frequency interfaces 240 mainly includes a broadband high speed interface, a narrowband low speed interface, a time synchronization interface, and a radio frequency control interface. The control DSP, the vector DSP, the communication accelerator, the interrupt controller, the radio frequency interface and the internal memory form a communication subsystem. Therefore, the Internet of Vehicles communication chip is complicated, which leads to that the Internet of Vehicles communication chip is difficulty to test online, and thus it is necessary to accurately position failure points of the communication chip.

Figure 3:
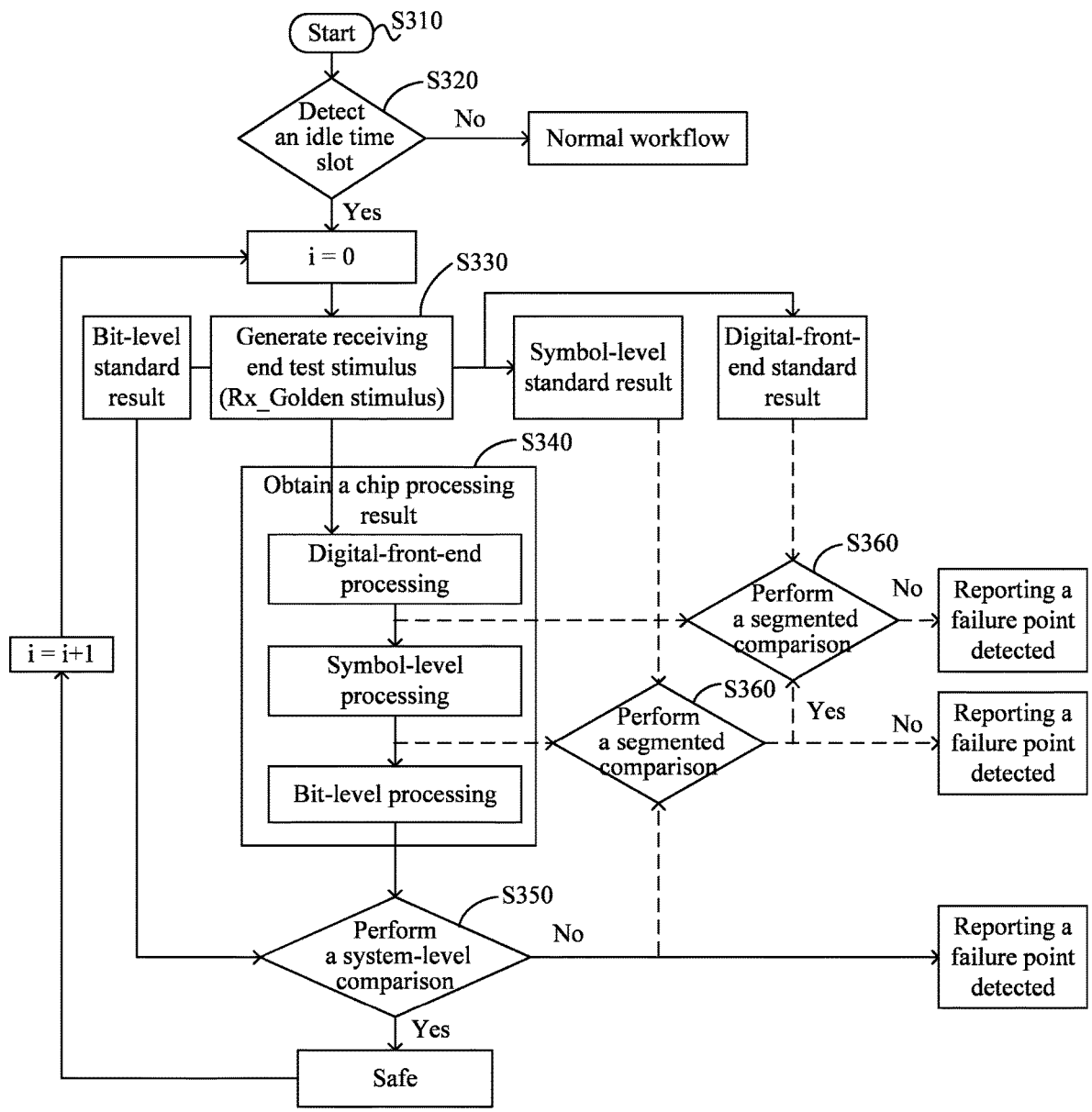
FIG. 3 is a schematic flowchart of a test method of an Internet of Vehicles communication chip according to embodiment one of the present application.

In an example of the present application scenario, the receiving end of the Internet of Vehicles communication chip described above is tested. FIG. 3 is a schematic flowchart of a test method of an Internet of Vehicles communication chip according to embodiment one of the present application, and the test method includes following operations S310-S360.

In S310, it is started; i.e., the online function safety test is started to be performed on the receiving end of the Internet of Vehicles communication chip.

In S320, an idle time slot is detected; i.e., the analog detection signal and/or the digital detection signal are sent to the receiving end of the Internet of Vehicles communication chip, and the idle time slot of the receiving end of the Internet of Vehicles communication chip is acquired according to the processing result of the Internet of Vehicles communication chip on the analog detection signal and/or the digital detection signal. In a case where the idle time slot is detected, then the receiving end of the Internet of Vehicles communication chip is tested; and in a case where the idle time slot is not detected, then the normal working flow of the Internet of Vehicles communication chip continues to be performed.

In S330, an Rx_Golden stimulus is generated, and a standard result corresponding to the Rx_Golden stimulus is generated, where the standard result corresponding to the Rx_Golden stimulus includes a digital-front-end standard result, a symbol-level standard result, and a bit-level standard result.

In S340, a chip processing result is obtained; for example, a data frame containing the Rx_Golden stimulus is sent to the receiving end of the Internet of Vehicles communication chip, so that the receiving end of the Internet of Vehicles communication chip processes the data frame to obtain a digital-front-end processing result, a symbol-level processing result and a bit-level processing result; and the digital-front-end processing result, the symbol-level processing result and the bit-level processing result sent by the receiving end of the Internet of Vehicles communication chip are received.

In S350, a system-level comparison is performed; whether the bit-level standard result and the bit-level processing result satisfy a consistency condition is determined; in response to a determination result that the bit-level standard result and the bit-level processing result satisfy the consistency condition, it is determined that the receiving end of the Internet of Vehicles communication chip is safe, and the next test of the receiving end of the Internet of Vehicles communication chip is started. In response to a determination result that the bit-level standard result and the bit-level processing result do not satisfy the consistency condition, it is determined that the receiving end of the Internet of Vehicles communication chip fails, a failure point is uploaded to the host, and segmented comparisons are performed.

In S360, segmented comparisons are performed; the digital-front-end standard result is compared with the digital-front-end processing result, and the symbol-level standard result is compared with the symbol-level processing result to obtain segmented comparison results; and when the digital-front-end standard result is inconsistent with the digital-front-end processing result and/or the symbol-level standard result is inconsistent with the symbol-level processing result, a failure point corresponding to the segmentation comparison results is uploaded to the host.

In the present application scene, the idle time slot of the receiving end of the Internet of Vehicles communication chip is tested in the running process of the Internet of Vehicles communication chip; the Rx_Golden stimulus is generated, and the standard result corresponding to the Rx_Golden stimulus is generated; the data frame containing the Rx_Golden stimulus is sent to the receiving end of the Internet of Vehicles communication chip, so that the receiving end of the Internet of Vehicles communication chip processes the data frame to obtain the chip processing result; and the chip processing result sent by the receiving end of the Internet of Vehicles communication chip is received, and the system-level comparison and the segmented comparison are performed on the chip processing result and the standard result, so that the failure point of the Internet of Vehicles communication chip is accurately positioned, and the problems in the related art that the test coverage rate of the communication chip is low and a large amount of communication chip resource performance is consumed in the test process are solved.

Embodiment Two

Figure 4:
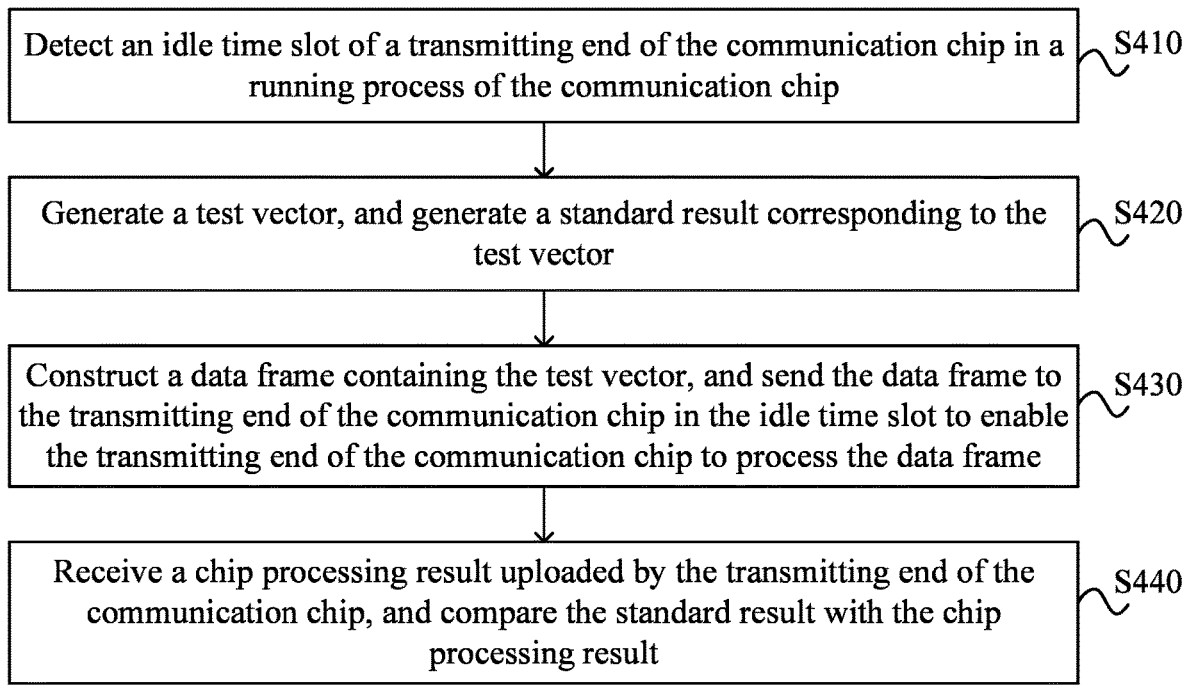
FIG. 4 is a schematic flowchart of a test method of a communication chip according to embodiment two of the present application.

FIG. 4 is a schematic flowchart of a test method of a communication chip according to embodiment two of the present application, the present embodiment is applicable to a case of performing the function safety test on the transmitting end of the communication chip in a running process of the communication chip, and the test method may be executed by a test apparatus of the communication chip. The test apparatus may be implemented in software and/or hardware and integrated in a computer device performing the test method. Referring to FIG. 4, the test method includes following operations S410-S440.

In S410, an idle time slot of a transmitting end of the communication chip is detected in a running process of the communication chip.

In the present embodiment, an index of the idle time slot may be acquired from system configuration parameters in the running process of the communication chip. In the present embodiment, the transmitting end of the communication chip sends a processing result of the communication chip to other modules or chips mainly according to a communication protocol, so that the idle time slot of the transmitting end of the communication chip may be detected only by querying the communication protocol of the communication chip in the system configuration parameters. The idle time slot of the transmitting end of the communication chip may be acquired without performing what is performed on the receiving end of the communication chip such as sending the analog detection signal and/or the digital detection signal to the receiving end of the communication chip and detecting the idle time slot of the receiving end of the communication chip according to the processing result to the analog detection signal and/or the digital detection signal by the communication chip.

In S420, a test vector is generated, and a standard result corresponding to the test vector is generated.

In the present embodiment, when the idle time slot of the transmitting end of the communication chip is detected, the test vector may be generated, and the standard result corresponding to the test vector is generated. In an embodiment, the test vector may be a transmitting end test stimulus Tx_Golden or other standard test stimulus, which is not limited in the embodiments of the present application.

In an embodiment, the standard result corresponding to the test vector includes a bit-level standard result, a symbol-level standard result and a digital-front-end standard result.

In S430, a data frame containing the test vector is constructed, and the data frame is sent to the transmitting end of the communication chip in the idle time slot to enable the transmitting end of the communication chip to process the data frame.

In the present embodiment, after the test vector is generated, the data frame including the test vector may be constructed, and the constructed data frame may be sent to the transmitting end of the communication chip in the idle time slot, so that the transmitting end of the communication chip processes the data frame so as to obtain a chip processing result. As an example, in a case where the test vector generated online is a test vector a, the data frame A including the test vector a may be constructed, and the data frame A may be sent to the transmitting end of the communication chip in the detected idle time slot of the transmitting end of the communication chip, so that the transmitting end of the communication chip processes the data frame A to obtain the chip processing result.

In an embodiment, the data frame is sent to the transmitting end of the communication chip in the idle time slot, and after receiving the data frame, the transmitting end of the communication chip sequentially performs a bit-level processing, a symbol-level processing, and a digital-front-end processing to the data frame, to respectively obtain a bit-level processing result, a symbol-level processing result, and a digital-front-end processing result as the chip processing result.

As an example, the computer device executing this test method may send the data frame A to the transmitting end of the communication chip in the idle time slot, and the transmitting end of the communication chip sequentially performs the bit-level processing, the symbol-level processing, and digital-front-end processing to the data frame A; and obtains a bit-level processing result, a symbol-level processing result and a digital-front-end processing result for the data frame A, respectively, and uploads the processing results as the chip processing results to the computer device for executing the test method.

In an embodiment, for the transmitting end of the communication chip, the test vector is original bit information, so that the transmitting end of the communication chip needs to perform the bit-level processing firstly, then the symbol-level processing and finally the digital-front-end processing on the data frame containing the test vector.

In S440, a chip processing result uploaded by the transmitting end of the communication chip is received, and the standard result is compared with the chip processing result.

In an embodiment, receiving the chip processing result sent by the transmitting end of the communication chip includes: receiving the bit-level processing result, the symbol-level processing result and the digital-front-end processing result uploaded by the transmitting end of the communication chip.

In the present embodiment, after the chip processing result is obtained, the standard result is compared with the chip processing result. Whether the digital-front-end standard result and the digital-front-end processing result satisfy a consistency condition is determined; in response to a determination result that the digital-front-end standard result and the digital-front-end processing result satisfy the consistency condition, it is determined that the transmitting end of the communication chip is safe; and in response to a determination result that the digital-front-end standard result and the digital-front-end processing result do not satisfy the consistency condition, the bit-level standard result is compared with the bit-level processing result, and the symbol-level standard result is compared with the symbol-level processing result to obtain segmented comparison results.

As an example, the digital-front-end standard result may be compared with the digital-front-end processing result firstly, and whether the digital-front-end standard result and the digital-front-end processing result satisfy the consistency condition is determined; in a case where the digital-front-end standard result and the digital-front-end processing result satisfy the consistency condition, then it is determined that the receiving end of the communication chip may be safe, and the function safety test of the transmitting end of the communication chip in a next cycle may be performed; and in a case where the bit-level standard result and the symbol-level standard result do not satisfy the consistency condition, then a failure point detected may be reported to the host or the server, and the bit-level standard result is continued to be compared with the bit-level processing result and compared the symbol-level standard result with the symbol-level processing result, to obtain segmented comparison results. The test method has the advantages that the failure range can be accurately determined or narrowed through the segmented comparison results, and users can conveniently and rapidly find a failure point to maintain the communication chip.

According to the scheme of the present embodiment, the idle time slot of the transmitting end of the communication chip is detected in the running process of the communication chip; the test vector is generated, and the standard result corresponding to the test vector is generated; the data frame containing the test vector is constructed, and the data frame is sent to the transmitting end of the communication chip in the idle time slot to enable the transmitting end of the communication chip to process the data frame; and the chip processing result uploaded by the transmitting end of the communication chip is received, and the standard result is compared with the chip processing result, so that an online test of function safety for the transmitting end of the communication chip is achieved, and the problems in the related art that the test coverage rate of the communication chip is low and a large amount of communication chip resource performance is consumed in the test process are solved.

Application Scenarios

Figure 5:
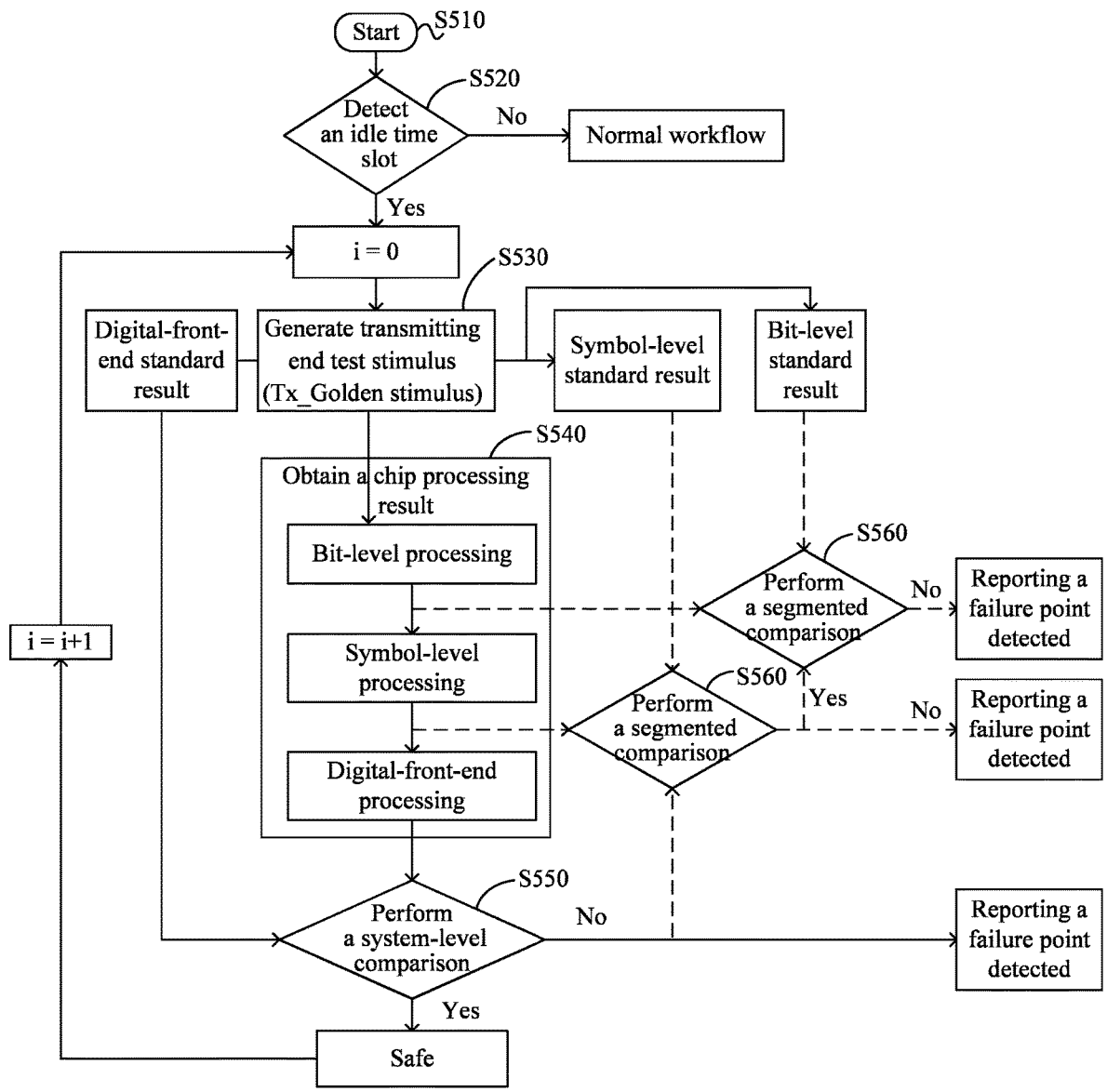
FIG. 5 is a schematic flowchart of a test method of an Internet of Vehicles communication chip according to embodiment two of the present application.

FIG. 5 is a schematic flowchart of a test method of an Internet of Vehicles communication chip according to embodiment two of the present application, and with reference to FIG. 5, the test method includes the following operations S510-S560.

In S510, it is started, i.e., the online function safety test is started to be performed on the transmitting end of the Internet of Vehicles communication chip.

In S520, an idle time slot is detected; i.e., the idle time slot of the transmitting end of the Internet of Vehicles communication chip is acquired from system configuration parameters. In a case where the idle time slot is detected, the test of the transmitting end of the Internet of Vehicles communication chip is performed; and in a case where the idle time slot is not detected, a normal working flow of the Internet of Vehicles communication chip is continued to be performed.

In S530, a Tx_Golden stimulus is generated, and a standard result corresponding to the Tx_Golden stimulus is generated, where the standard result corresponding to the Tx_Golden stimulus includes a bit-level standard result, a symbol-level standard result, and a digital-front-end standard result.

In S540, a chip processing result is obtained. For example, the data frame containing the Tx_Golden stimulus is sent to the transmitting end of the Internet of Vehicles communication chip to enable the transmitting end of the Internet of Vehicles communication chip to process the data frame to obtain the bit-level processing result, the symbol-level processing result and the digital-front-end processing result; and the digital-front-end processing result, the symbol-level processing result and the bit-level processing result sent by the receiving end of the Internet of Vehicles communication chip are received.

In S550, a system-level comparison is performed, and whether the digital-front-end standard result and the digital-front-end processing result satisfy the consistency condition is determined. In response to a determination result that the digital-front-end standard result and the digital-front-end processing result satisfy the consistency condition, it is determined that the transmitting end of the Internet of Vehicles communication chip is safe, and a next test of the transmitting end of the Internet of Vehicles communication chip is started; and in response to a determination result that the digital-front-end standard result and the digital-front-end processing result do not satisfy the consistency condition, it is determined that the transmitting end of the Internet of Vehicles communication chip fails, a failure point is uploaded to the host, and segmented comparisons are performed.

In S560, segmented comparisons are performed; the bit-level standard result is compared with the bit-level processing result, and the symbol-level standard result is compared with the symbol-level processing result to obtain segmented comparison results; and when the segmentation comparison results are that the bit-level standard result is inconsistent with the bit-level processing result and/or the symbol-level standard result is inconsistent with the symbol-level processing result, a failure point corresponding to the segmentation comparison results are uploaded to the host.

In the application scenario, the idle time slot of the transmitting end of the Internet of Vehicles communication chip is tested in the running process of the Internet of Vehicles communication chip; the Tx_Golden stimulus is generated, and the standard result corresponding to the Tx_Golden stimulus is generated; the data frame containing the Tx_Golden stimulus is sent to the transmitting end of the Internet of Vehicles communication chip to enable the transmitting end of the Internet of Vehicles communication chip to process the data frame to obtain the bit-level processing result, the symbol-level processing result and the digital-front-end processing result; the chip processing result sent by the transmitting end of the Internet of Vehicles communication chip is received, and the chip processing result is compared with the standard result in a system-level manner and in a segmented manner, respectively, so that the failure point of the Internet of Vehicles communication chip is accurately positioned, and the problems in the related art that the test coverage rate of the communication chip is low and a large amount of communication chip resource performance is consumed in the test process are solved.

Figure 6:
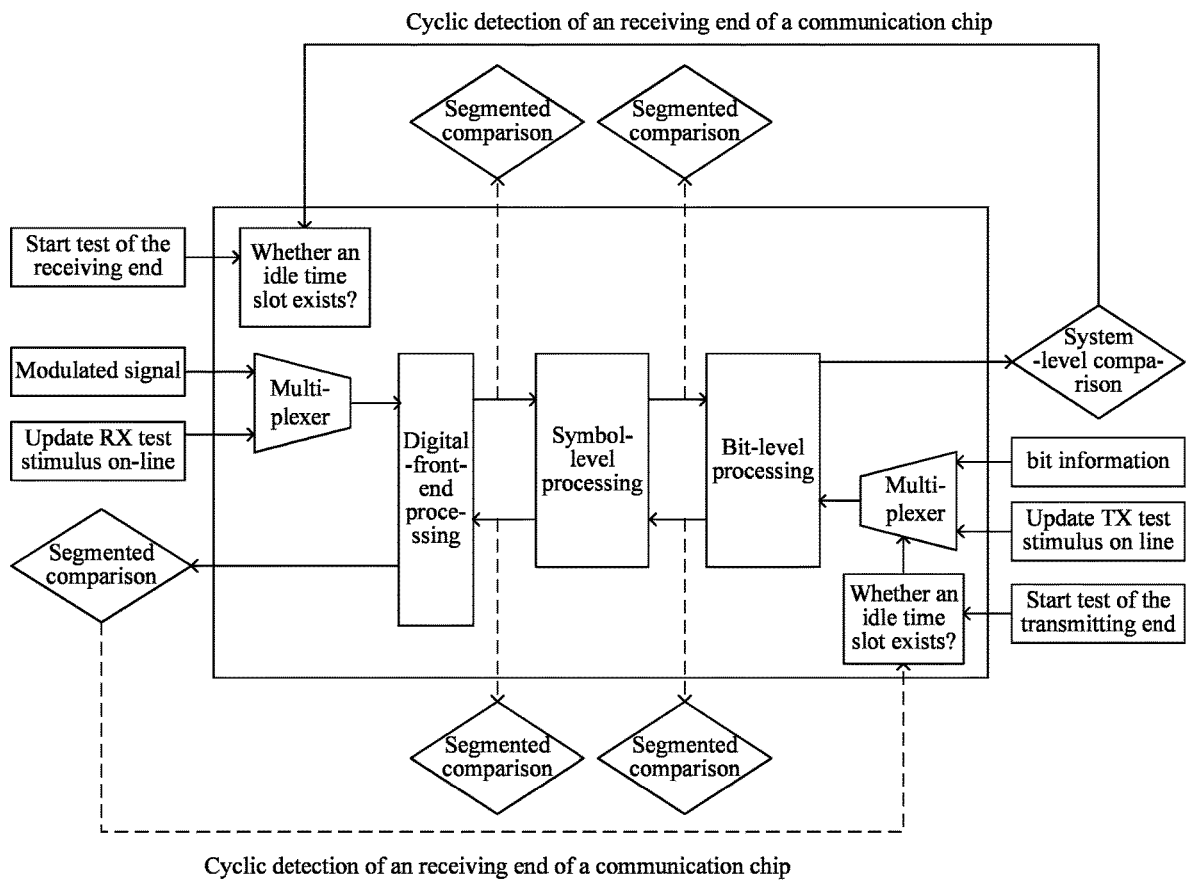
FIG. 6 is another schematic flowchart of a test method of an Internet of Vehicles communication chip according to embodiment two of the present application.

FIG. 6 is a schematic flowchart of another online test method of an Internet of Vehicles communication chip provided according to embodiment two of the present application, and the method includes a receiving end test method of the Internet of Vehicles communication chip and a transmitting end test method of the Internet of Vehicles communication chip.

In an embodiment, when the receiving end test method of the Internet of Vehicles communication chip begins, whether an idle time slot of the receiving end of the Internet of Vehicles communication chip is detected firstly, in a case where the idle time slot exists, the RX test stimulus is updated online, a data frame containing the RX test stimulus is constructed, and the data frame is sent to the receiving end of the communication chip in the idle time slot of the receiving end of the Internet of Vehicles communication chip; after receiving the data frame, the communication chip sequentially performs a digital-front-end processing, a symbol-level processing and a bit-level processing to the data frame to respectively obtain a digital-front-end processing result, a symbol-level processing result and a bit-level processing result, which are taken as a chip processing result; and a system-level comparison and segmented comparisons are performed on the standard result and the chip processing result.

The embodiment six of the present application further provides a non-transitory storage medium containing a computer executable instruction, the computer executable instruction is used for performing, when executed by a computer processor, a test method of a communication chip, and the method includes: an idle time slot of the receiving end of the communication chip is detected in a running process of the communication chip; a test vector is generated, and a standard result corresponding to the test vector is generated; a data frame containing the test vector is constructed, and the data frame is sent to the receiving end of the communication chip in the idle time slot to enable the receiving end of the communication chip to process the data frame; and a chip processing result uploaded by the receiving end of the communication chip is received, and the standard result is compared with the chip processing result.

In the above examples, the on-line monitoring of the function safety of the transmitting end and the receiving end of the Internet of Vehicles communication chip is achieved, respectively, and the problems in the related art that the test coverage rate of the communication chip is low and a large amount of communication chip resource performance is consumed in the test process are solved.

Embodiment Three

Figure 7:
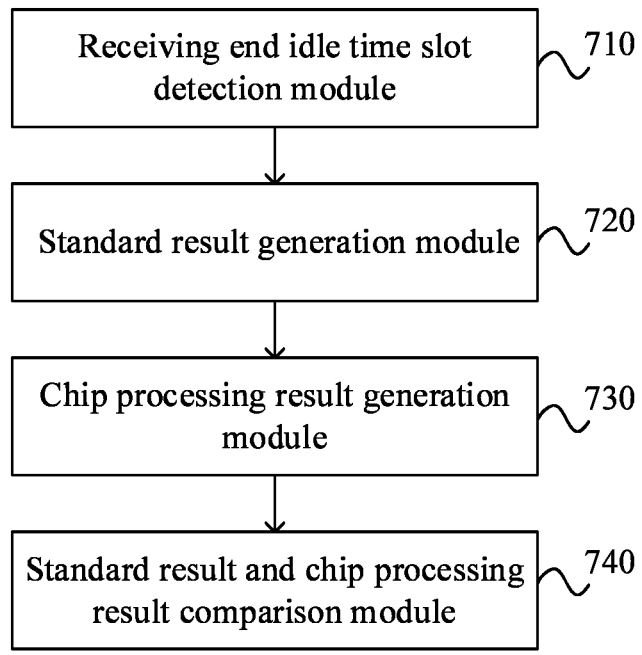
FIG. 7 is a schematic structural diagram of a test apparatus of a communication chip according to embodiment three of the present application.

FIG. 7 is a schematic structural diagram of a test apparatus of a communication chip according to embodiment three of the present application. The test apparatus may be implemented in software and/or hardware, and the test apparatus, when executing, may implement the test method of the communication chip described in any of the embodiments of the present application, and in an embodiment, the test apparatus mainly includes: a receiving end idle time slot detection module 710, a standard result generation module 720, a chip processing result generation module 730, and a standard result and chip processing result comparison module 740.

In the embodiment, the receiving end idle time slot detection module 710 is configured to detect, in a running process of the communication chip, an idle time slot of a receiving end of the communication chip. The standard result generation module 720 is configured to generate a test vector and a standard result corresponding to the test vector. The chip processing result generation module 730 is configured to construct a data frame containing the test vector, and send the data frame to the receiving end of the communication chip in the idle time slot to enable the receiving end of the communication chip to process the data frame. The standard result and chip processing result comparison module 740 is configured to receive a chip processing result uploaded by the receiving end of the communication chip, and compare the standard result with the chip processing result.

According to the schemes of the present embodiment, the idle time slot detection module of the receiving end is configured to detect, in the running process of the communication chip, the idle time slot of the receiving end of the communication chip. The standard result generation module is configured to generate the test vector and the standard result corresponding to the test vector. The chip processing result generation module is configured to construct the data frame containing the test vector, and send the data frame to the receiving end of the communication chip in the idle time slot to enable the receiving end of the communication chip to process the data frame. The standard result and chip processing result comparison module is configured to receive a chip processing result uploaded by the receiving end of the communication chip, and compare the standard result with the chip processing result, so that the on-line test of the function safety of the communication chip is achieved, and the problems in the related art that the test coverage rate of the communication chip is low and a large amount of communication chip resource performance is consumed in the test process are solved.

In an embodiment, the receiving end idle time slot detection module 710 further includes a detection signal sending unit, the detection signal sending unit is configured to send a detection signal to the receiving end of the communication chip, receive a processing result of the detection signal uploaded by the receiving end of the communication chip, and acquire an idle time slot of the receiving end of the communication chip according to the processing result of detection signal by the receiving end of the communication chip. In the present embodiment, the detection signal includes at least one of an analog detection signal or a digital detection signal.

In an embodiment, the chip processing result generation module 730 is configured to receive the chip processing result uploaded by the receiving end of the communication chip by receiving the digital-front-end processing result, the symbol-level processing result, and the bit-level processing result uploaded by the receiving end of the communication chip. In the present embodiment, the digital-end processing result, the symbol-level processing result and the bit-level processing result are respectively a result obtained by performing a digital-front-end processing to the data frame, a result obtained by performing a symbol-level processing to the data frame subjected to the digital-front-end processing, and a result obtained by performing a bit-level processing to the data frame subjected to the symbol-level processing by the receiving end of the communication chip.

In an embodiment, the standard result involved in the present embodiment includes a digital-front-end standard result, a symbol-level standard result and a bit-level standard result.

In an embodiment, the standard result and chip processing result comparison module 740 further includes segmented comparison results generation unit, the segmented comparison result generation unit is configured to determine whether the bit-level standard result and the bit-level processing result satisfy a consistency condition; in response to a determination result that the bit-level standard result and the bit-level processing result satisfy the consistency condition, it is determined that the receiving end of the communication chip is safe; and in response to a determination result that the bit-level standard result and the bit-level processing result do not satisfy the consistency condition, the digital-front-end standard result is compared with the digital-front-end processing result, and the symbol-level standard result is compared with the symbol-level processing result to obtain segmented comparison results.

The receiving end test apparatus of the communication chip provided in the embodiments of the present application may execute the receiving end test method of the communication chip provided in any of the embodiments of the present application, and have corresponding function modules to execute the receiving end test method of the communication chip.

Embodiment Four

Figure 8:
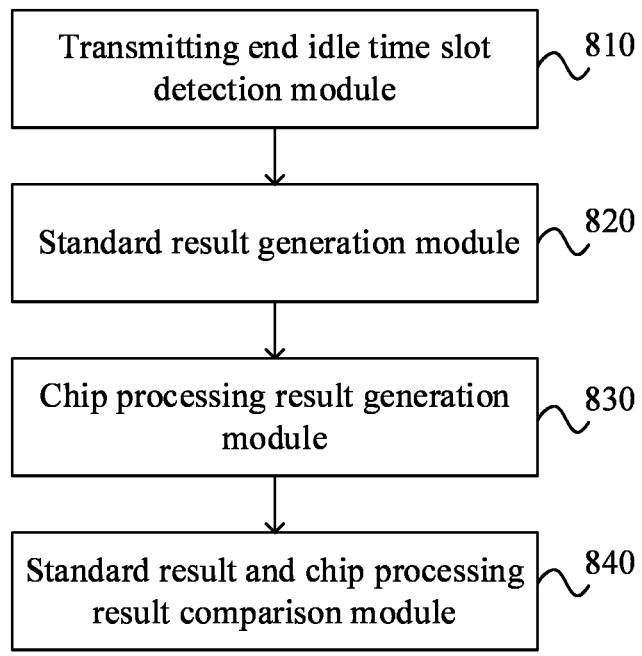
FIG. 8 is a schematic structural diagram of a test apparatus of a communication chip according to embodiment four of the present application.

FIG. 8 is a schematic structural diagram of a test apparatus of a communication chip according to embodiment four of the present application. The test apparatus may be implemented in software and/or hardware, and the test apparatus, when executing, may implement the test method of the communication chip described in any of the embodiments of the present application, for example, the test apparatus mainly includes: a transmitting end idle time slot detection module 810, a standard result generation module 820, a chip processing result generation module 830 and a standard result and chip processing result comparison module 840.

In the present embodiment, the transmitting end idle time slot detection module 810 is configured to detect, in a running process of the communication chip, an idle time slot of a transmitting end of the communication chip; the standard result generation module 820 is configured to generate a test vector and a standard result corresponding to the test vector; the chip processing result generation module 830 is configured to construct a data frame containing the test vector, and send the data frame to the transmitting end of the communication chip in the idle time slot of the transmitting end of the communication chip to enable the transmitting end of the communication chip to process the data frame; and the standard result and chip processing result comparison module 840 is configured to receive a chip processing result uploaded by the transmitting end of the communication chip, and compare the standard result with the chip processing result.

According to the scheme of the present embodiment, the idle time slot detection module of the transmitting end is configured to detect, in the running process of the communication chip, the idle time slot of the transmitting end of the communication chip; the standard result generation module is configured to generate the test vector and the standard result corresponding to the test vector; the chip processing result generation module is configured to construct the data frame containing the test vector, and send the data frame to the transmitting end of the communication chip in the idle time slot to enable the transmitting end of the communication chip to process the data frame; and the standard result and chip processing result comparison module is configured to receive the chip processing result uploaded by the transmitting end of the communication chip, and compare the standard result with the chip processing result, so that the on-line test of the function safety of the communication chip is achieved, and the problems in the related art that the test coverage rate of the communication chip is low and a large amount of communication chip resource performance is consumed in the test process are solved.

In an embodiment, the chip processing result generation module 830 is configured to receive the chip processing result uploaded by the transmitting end of the communication chip by receiving the bit-level processing result, the symbol-level processing result, and the digital-front-end processing result uploaded by the transmitting end of the communication chip as the chip processing result. In the present embodiment, the bit-level processing result, the symbol-level processing result and the digital-front-end processing result are respectively a result obtained by performing a bit-level processing to the data frame, a result obtained by performing a symbol-level processing to the data frame subjected to the bit-level processing, and a result obtained by performing a digital-front-end processing to the data frame subjected to the symbol-level processing by the receiving end of the communication chip.

In an embodiment, the standard result involved in the present embodiment includes a bit-level standard result, a symbol-level standard result, and a digital-front-end standard result.

In an embodiment, the standard result and chip processing result comparison module 840 further includes segmented comparison results generation unit, the segmented comparison result generation unit is configured to determine whether the digital-front-end standard result and the digital-front-end processing result satisfy a consistency condition; in response to a determination result that the digital-front-end standard result and the digital-front-end processing result satisfy a consistency condition, and it is determined that the transmitting end of the communication chip is safe; and in response to a determination result that the digital-front-end standard result and the digital-front-end processing result do not satisfy the consistency condition, the bit-level standard result is compared with the bit-level processing result, and the symbol-level standard result is compared with the symbol-level processing result to obtain the segmented comparison results.

The transmitting end test apparatus of the communication chip provided in the embodiments of the present application may execute the transmitting end test method of the communication chip provided in any of the embodiments of the present application, and have corresponding function modules to execute the method.

Embodiment Five

Figure 9:
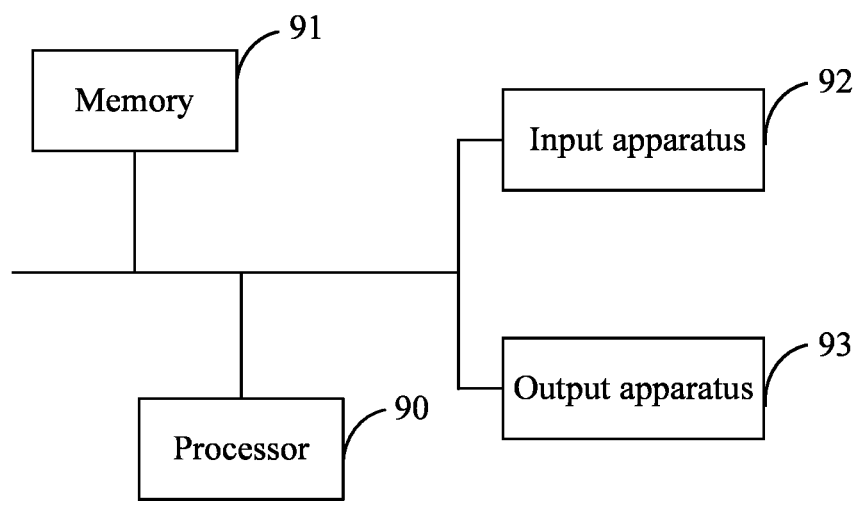
FIG. 9 is a schematic structural diagram of a computer device according to embodiment five of the present application.

FIG. 9 is a schematic structural diagram of a computer device according to embodiment five of the present application, the computer device includes a processor 90, a memory 91, an input apparatus 92 and an output apparatus 93, as shown in FIG. 9; a number of processors 90 in the computer device is at least one, and one processor 90 is used as an example in FIG. 9; the processor 90, the memory 91, the input apparatus 92 and the output apparatus 93 in the computer apparatus may be connected by a bus or other means, for example by a bus in FIG. 9.

As a computer readable storage medium, the memory 91 may be configured to store a software program, a computer executable program, and a module, for example, a program instruction/module corresponding to a receiving end test method of the communication chip in the embodiments of the present application (such as, the receiving end idle time slot detection module 710, the standard result generation module 720, the chip processing result generation module 730, and the standard result and chip processing result comparison module 740 at the receiving end of the communication chip in the receiving end test apparatus), or a program instruction/module corresponding to a transmitting end test method of the communication chip in the embodiments of the present application (such as, the transmitting end idle time slot detection module 810, the standard result generation module 820, the chip processing result generation module 830, and the standard result and chip processing result comparison module 840 at the transmitting end of the communication chip in the transmitting end test apparatus). By running the software programs, instructions, and modules stored in the memory 91, the processor 90 performs various functional applications and data processing of the computer device, that is, implements the receiving end test method of the communication chip or the transmitting end test method of the communication chip described above.

The memory 91 may mainly include a storage program region and a storage data region, the storage program region may store an operating system, an application program required for at least one function; the storage data region may store data created according to the use of the terminal. Moreover, the memory 91 may include a high-speed random access memory, or may include a non-volatile memory, such as at least one disk memory device, a flash memory device, or other non-volatile solid-state memory device. In some instances, the memory 91 may include memories that are remotely disposed relative to the processor 90, and these remote memories may be connected to the computer device through a network. Examples of the above networks include, but are not limited to, the Internet, intranets, LANs, mobile communication networks and combinations thereof.

The input apparatus 92 may be configured to receive input numeric or character information and to generate a key signal input related to user settings and functional controls of the computer device. The output apparatus 93 may include a display device such as a display screen.

Embodiment Six

The embodiment six of the present application further provides a storage medium containing a computer executable instruction, the computer executable instruction is used for performing, when executed by a computer processor, a test method of a communication chip, and the method includes: an idle time slot of the receiving end of the communication chip is detected in a running process of the communication chip; a test vector is generated, and a standard result corresponding to the test vector is generated; a data frame containing the test vector is constructed, and the data frame is sent to the receiving end of the communication chip in the idle time slot to enable the receiving end of the communication chip to process the data frame; and a chip processing result uploaded by the receiving end of the communication chip is received, and the standard result is compared with the chip processing result Alternatively, the test method of the communication chip includes the following: in a running process of the communication chip, an idle time slot of a transmitting end of the communication chip is detected; a test vector is generated, and a standard result corresponding to the test vector is generated; a data frame containing the test vector is constructed, and the data frame is sent to the transmitting end of the communication chip in the idle time slot to enable the transmitting end of the communication chip to process the data frame; and a chip processing result uploaded by the transmitting end of the communication chip is received, and the standard result is compared with the chip processing result.

Of course, according to a storage medium containing a computer executable instruction provided in an embodiment of the present application, the computer executable instruction is not limited to the operation of the method described above and may also execute the related operation in the receiving end test method of the communication chip or the transmitting end test method of the communication chip provided in any of the embodiments of the present application.

Those skilled in the art will appreciate from the above description of the implementation manners that the present application may be implemented by means of software and general purpose hardware, and of course may also be implemented by hardware. Based on this understanding, the technical scheme of the present application may be embodied in the form of a software product, and the computer software product may be stored in a computer readable storage medium, such as a floppy disk of a computer, a read-only memory (ROM), a random access memory (RAM), a flash memory (FLASH), a hard disk or an optional disk, including multiple instructions to enable a computer device (which may be a personal computer, a server, or a network device, etc.) to perform the method of any of the embodiments of the present application.

In the embodiments of the receiving end test apparatus or the transmitting end test apparatus of the communication chip described above, multiple units and modules included in the receiving end test apparatus or the transmitting end test apparatus of the communication chip are only divided according to functional logic, but are not limited to the division described above, and only corresponding functions may be achieved; in addition, the names of the multiple functional units are also only for convenience of distinguishing from each other and are not used for limiting the scope of protection of the present application.

What is claimed is:

1. A test method of a communication chip, comprising:
   in a running process of the communication chip, detecting an idle time slot of a transceiving end of the communication chip, wherein the transceiving end transmits and receives communication signals from the communication chip;
   generating a test vector, and generating a standard result corresponding to the test vector;

constructing a data frame containing the test vector, and sending the data frame to the transceiving end of the communication chip in the idle time slot to enable the transceiving end of the communication chip to process the data frame; and receiving a chip processing result uploaded by the transceiving end of the communication chip, and comparing the standard result with the chip processing result;

wherein receiving the chip processing result uploaded by the receiving transceiving end of the communication chip comprises:

receiving a digital-front-end processing result, a symbol-level processing result and a bit-level processing result uploaded by the transceiving end of the communication chip, wherein the digital-front-end processing result, the symbol-level processing result and the bit-level processing result are respectively a result obtained by performing a digital-front-end processing to the data frame, a result obtained by performing a symbol-level processing to the data frame subjected to the digital-front-end processing, and a result obtained by performing a bit-level processing to the data frame subjected to the symbol-level processing by the transceiving end of the communication chip;

wherein the standard result comprises a digital-front-end standard result, a symbol-level standard result, and a bit-level standard result; and wherein comparing the standard result with the chip processing result comprises:

determining whether the bit-level standard result and the bit-level processing result satisfy a consistency condition;

in response to a determination result that the bit-level standard result and the bit-level processing result satisfy the consistency condition, determining that the transceiving end of the communication chip is safe; and in response to a determination result that the bit-level standard result and the bit-level processing result do not satisfy the consistency condition, comparing the digital-front-end standard result with the digital-front-end processing result, and comparing the symbol-level standard result with the symbol-level processing result to obtain segmented comparison results.

2. The method of claim 1, wherein detecting the idle time slot of the transceiving end of the communication chip comprises:

sending a detection signal to the transceiving end of the communication chip, receiving a processing result of the detection signal uploaded by the transceiving end of the communication chip, and acquiring the idle time slot of the transceiving end of the communication chip according to the processing result of the detection signal by the transceiving end of the communication chip, wherein the detection signal comprises at least one of an analog detection signal or a digital detection signal.

3. A computer device, comprising a memory, a processor and a computer program stored in the memory and executable by the processor, wherein the computer program, when executed by the processor, implements the test method of the communication chip of claim 1.

4. A non-transitory computer-readable storage medium, storing a computer program, wherein the computer program, when executed by a processor, implements the test method of the communication chip of claim 1.

* * * * *